(12) United States Patent  (10) Patent No.: US 8,381,048 B2
Araki  (45) Date of Patent: Feb. 19, 2013

(54) TRANSMISSION SYSTEM, METHOD AND PROGRAM

(75) Inventor: Toshinori Araki, Tokyo (JP)

(73) Assignee: NEC Corporation, Tokyo (JP)

( * ) Notice: Subject to any disclaimer, the term of this patent is extended or adjusted under 35 U.S.C. 154(b) by 446 days.

(21) Appl. No.: 12/672,514

(22) PCT Filed: Aug. 6, 2008

(86) PCT No.: PCT/JP2008/064092
§ 371 (c)(1),
(2), (4) Date: Feb. 7, 2010

(87) PCT Pub. No.: WO2009/020143
PCT Pub. Date: Feb. 12, 2009

(65) Prior Publication Data
US 2012/0011419 A1  Jan. 12, 2012

(30) Foreign Application Priority Data
Aug. 6, 2007  (JP) .................................. 2007-204133

(51) Int. Cl.
*G01R 31/28* (2006.01)
(52) U.S. Cl. .................... 714/712; 714/715; 714/781
(58) Field of Classification Search .................. 714/712, 714/715, 781
See application file for complete search history.

(56) References Cited

U.S. PATENT DOCUMENTS

| 6,598,203 | B1 * | 7/2003 | Tang | 714/790 |
| 7,426,676 | B2 * | 9/2008 | Vityaev | 714/769 |
| 2005/0273690 | A1 * | 12/2005 | Wu | 714/781 |
| 2008/0115041 | A1 * | 5/2008 | Park et al. | 714/785 |
| 2012/0011419 | A1 * | 1/2012 | Araki | 714/784 |

FOREIGN PATENT DOCUMENTS

| JP | 2005-130404 A | 5/2005 |
| JP | 2007-135170 A | 5/2007 |
| JP | 2007-235516 A | 9/2007 |

OTHER PUBLICATIONS

International Search Report for PCT/JP2008/064092, mailed Sep. 9, 2008.
D. Dolev et al., "Perfectly Secure Message Transmission", J.ACM 40(1), pp. 36-45 (1990).
G. Blakley et al., "Security of Ramp Scheme", Procedures of Cryptology, vol. 6, No. 3, pp. 242-268, 1993.
D. Stinson, "On the Connections Between Universal Hashing, Combinatorial Designs and Error-Correcting Codes", Congressus Numerantium 114 (1996), pp. 1-21.

\* cited by examiner

*Primary Examiner* — Joshua Lohn

(57) ABSTRACT

A transmitting apparatus generates and transmits 3t+1 or more number of codewords for a message and multiple faulty encoded message identifying data, wherein the information regarding the message may not be obtained from t or less number of encoded messages and the message can be decoded from 2t+1 or more codewords. The faulty encoded message identifying data are able to detect t or less number of faulty codewords of the message, even if there are t or less number of faulty codewords. A receiving apparatus checks whether there is no fault in each codeword for the message, using the codewords of the message and faulty encoded message identifying data for the codewords of the message received and the corresponding faulty encoded message identifying data and also checks whether the codewords decided to be non-faulty are all of the same message. The receiving apparatus, if the codewords decided to be non-faulty are all of the same message, decodes the message from the codewords decided to be non-faulty, and outputs the so decoded message and if otherwise, outputs a signal indicating failure in message reception.

13 Claims, 10 Drawing Sheets

TRANSMISSION SYSTEM, METHOD AND PROGRAM

This application is the National Phase of PCT/JP2008/064092, filed on Aug. 6, 2008, and is based upon and claims the benefit of the priority of Japanese patent application No. 2007-204133, filed on Aug. 6, 2007, the disclosure of which is incorporated herein in its entirety by reference thereto.

TECHNICAL FIELD

This invention relates to a system, a method and a program for transmission.

BACKGROUND ART

There are a large variety of methods for message transmission over a network. These methods are required to possess a function such as the function of (A) transmitting a message with sufficient accuracy even though the network suffers from certain faults.

The method has various other functions, depending on the uses and applications. Of these other functions, (B) the function of not having listening adversaries learn what is being sent; and (C) the function of verifying whether or not the message received has been tampered with are among the most important functions.

One of the message transmission methods, having the above mentioned functions (A) to (C), is such a message transmission method in which there are provided a plurality of channels between a transmitting apparatus and a receiving apparatus and which has the following three functions. It is assumed that the number of the channels between the transmitting and receiving apparatuses is n. These functions are:
(1) the function that, even if there is an adversary who is able to tamper with and learn the information data being sent over up to t number of channels, the receiving apparatus is able to receive the message sent by the transmitting apparatus with a predominantly high probability;
(2) the function that, even if there is an adversary who is able to tamper with and learn the information data being sent over up to t number of channels, the adversary is entirely unable to estimate the message being sent by the transmitting apparatus; and
(3) the function that, even if there is an adversary who is able to tamper with and learn the information data being sent over up to t number of channels, it never occurs that the receiving apparatus receives a value other than the message sent by the transmitting apparatus. It is noted that the above mentioned number t is termed 'the presumed number of the faulty channels.

It has been known that such message transmission method may or may not be implemented depending on the relationships between the number t and the number n.

For $n \geq 3t+1$, the method may be implemented using a system disclosed in Non-Patent Document 1.

If, in case of using the method described in Non-Patent Document 1, $$n = 3t+d+1,$$

d' is of a value such that $$d \geq d' \geq 0.$$

The message is selected from a set of the numbers of elements $p^{\{x\}}$, and the data sent over the respective channels is a set of numbers of elements $p^{\{x-d'\}}$.

Although the foregoing description is for the case of using the channels, there is no limitation to the means for implementing the channels provided that the data may be divided into different sections and that these sections may be sent.
[Non-Patent Document 1] D. Dolev, C. Dwork, O. Waarts, M. Yung: Perfectly Secure Message Transmission. J. ACM 40(1) 17-47 (1993)
[Non-Patent Document 2] G. R. Blakley, C. Meadows: Security of Ramp Scheme. Proc. of Cryptology, Vol. 6, No. 3, pp. 157-167, 1993
[Non-Patent Document 3] D. R. Stinson: On the Connections Between Universal Hashing, Combinatorial Designs and Error-Correcting Codes. Congressus Numerantium 114 (1996), 7-27.

SUMMARY

The disclosures of the Non-Patent Documents 1 to 3 are incorporated herein by reference. The following analysis is made from the side of the present invention.

In the message transmission system, constructed in accordance with the method of Non-Patent Document 1, a large size of data is transmitted over the channels.

It is an object of the present invention to provide a system, a method and a computer-readable recording medium storing a program for transmission according to which the size of data transmission over each channel is smaller than that in the message transmission system proposed by Non-Patent Document 1.

In one aspect of the present invention, there is provided an encoder, an encoding method and a computer-readable recording medium storing a program for encoding. The encoder, encoding method or the computer-readable recording medium storing a program for encoding includes a message encoding apparatus (step or process). A message is input, and a plurality of codewords for the message is generated. The codewords are generated in such a manner that the information regarding the message may not be obtained from t or less number of the codewords, and that the message may be decoded from 2t+1 or more number of non-faulty codewords. The encoder, encoding method or the computer-readable recording medium storing a program for encoding also includes a faulty codeword identifying data generating apparatus (step or process). If, in case the codewords for the message are received and the message is restored from the codewords, faulty codewords, the number of which is less than or equal to t, is contained in the input codewords, the faulty codeword identifying data generating apparatus (step or a process) generates faulty codeword identifying data to identify the faulty codewords. The codewords of the message and the faulty codeword identifying data are output.

According to the present invention, if t or less number of faulty faulty codeword identifying data are contained in the faulty codeword identifying data, the apparatus, step or the process for generating faulty codeword identifying data generates faulty codeword identifying data capable of correcting the faulty faulty codeword identifying data.

According to the present invention, the apparatus (step or process) for generating faulty codeword identifying data generates a codeword, obtained on Reed-Solomon coding random source states, as the faulty codeword identifying data.

In the present invention, there are provided a message encoder (encoding method or process for encoding) that inputs a message and generates codewords in such a manner that the information regarding the message may not be obtained from t or less number of the codewords, and the message may be decoded from 2t+1 or more number of non-faulty codewords. The present invention also includes a function data encoding apparatus that selects data representing a random universal hash function from a data set representing a group of universal hash functions and that encodes data representing the universal hash function in such a manner that faulty codewords are correctable even if there exists the faulty codewords, the number of which is less than or equal to t.

In the present invention, there is also provided a faulty codeword identifying data generation apparatus (step or process) that outputs, as the faulty codeword identifying data, the results of calculations on the codewords of the message entered to the universal hash function.

The codewords of the message, the codewords of the data representing the universal hash function and the faulty codeword identifying data are output.

As the universal hash function, such a function is used in which the probability that an input having the same output as the output of an optional one of the inputs is selectable is sufficiently low, even if t number of sets of the input/output relationships for the universal hash function, selected at random out of the functions of the universal hash function group, has become known.

In the present invention, there is also provided a function data encoding apparatus (step or process) that generates a codeword obtained on Reed-Solomon coding data representing a universal hash function as a codeword of data representing the universal hash function.

In the present invention, there is a decoder (a decoding method and a computer-readable recording medium storing a program for decoding) including a faulty codeword identifying apparatus (step or process) and a message decoding apparatus (step or process). The faulty codeword identifying apparatus (step or process) inputs codewords and faulty codeword identifying data as inputs and identifies faulty codewords using the faulty codeword identifying data. The message decoding apparatus (step or process) decides whether or not the codewords of a set of codewords not decided by the faulty codeword identifying apparatus to be faulty codewords can be decoded to the same message, by way of checking for sameness of the set of codewords. The message decoding apparatus decodes the message from the codewords decided to be non-faulty and outputs the so decoded message in case of decision for sameness of the codewords. The message decoding apparatus outputs a failure in decoding in case of decision to the contrary.

In the present invention, there is also provided a decoder (a decoding method and a computer-readable recording medium storing a program for decoding) including a faulty codeword identifying data correction apparatus (step or process) that corrects faulty faulty codeword identifying data.

In the present invention, there is also provided a decoder (a decoding method and a computer-readable recording medium storing a program for decoding) including a faulty encoded message identifying apparatus (step or process). The faulty encoded message identifying apparatus (step or process) corrects faulty faulty codeword identifying data by process for Reed-Solomon error correction.

In the present invention, there is also provided a decoder (a decoding method and a computer-readable recording medium storing a program for decoding). The decoder (decoding method or program for decoding) includes a function data decoding apparatus (step or process) that inputs codewords of a message, codewords of data representing a universal hash function and faulty codeword identifying data and that corrects the faulty codewords of the universal hash function to decode data representing the universal hash function The decoder (decoding method and computer-readable recording medium storing a program for decoding) includes a faulty codeword identifying apparatus (step or process) identifying faulty codewords, using the faulty function output identifying data, out of outputs corresponding to inputs of the codewords of the message to the decoded universal hash function, using the faulty function output identifying data.

The decoder (the decoding method and the computer-readable recording medium storing a program for decoding) includes a message decoding apparatus (step or process) that decides whether or not the codewords of a set not decided by the faulty codeword identifying apparatus to be faulty codewords can be decoded to the same message, by way of checking for sameness of the codewords of the set. The message decoding apparatus (step or process) decodes the message from the codewords decided to be non-faulty and outputs the message decoded in case of decision for the sameness of the codewords. The message decoding apparatus (step or process) outputs a failure in decoding in case of decision to the contrary.

As the universal hash function, such a function is used in which the probability that an input having the same output as the output of an optional one of the inputs is selectable is sufficiently low, even if t number of input/output relationship sets of a universal hash function, selected at random out of the universal hash functions, has become known.

In the decoder (the decoding method or the computer-readable recording medium storing a program for decoding), there is provided a function data decoder (decoding step or process) that corrects codewords of data representing a faulty universal hash function by a Reed-Solomon error correction process.

According to the present invention, the size of data sent over respective channels in the message transmission system may be made smaller than in the conventional system.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED MODES

Figure 1:
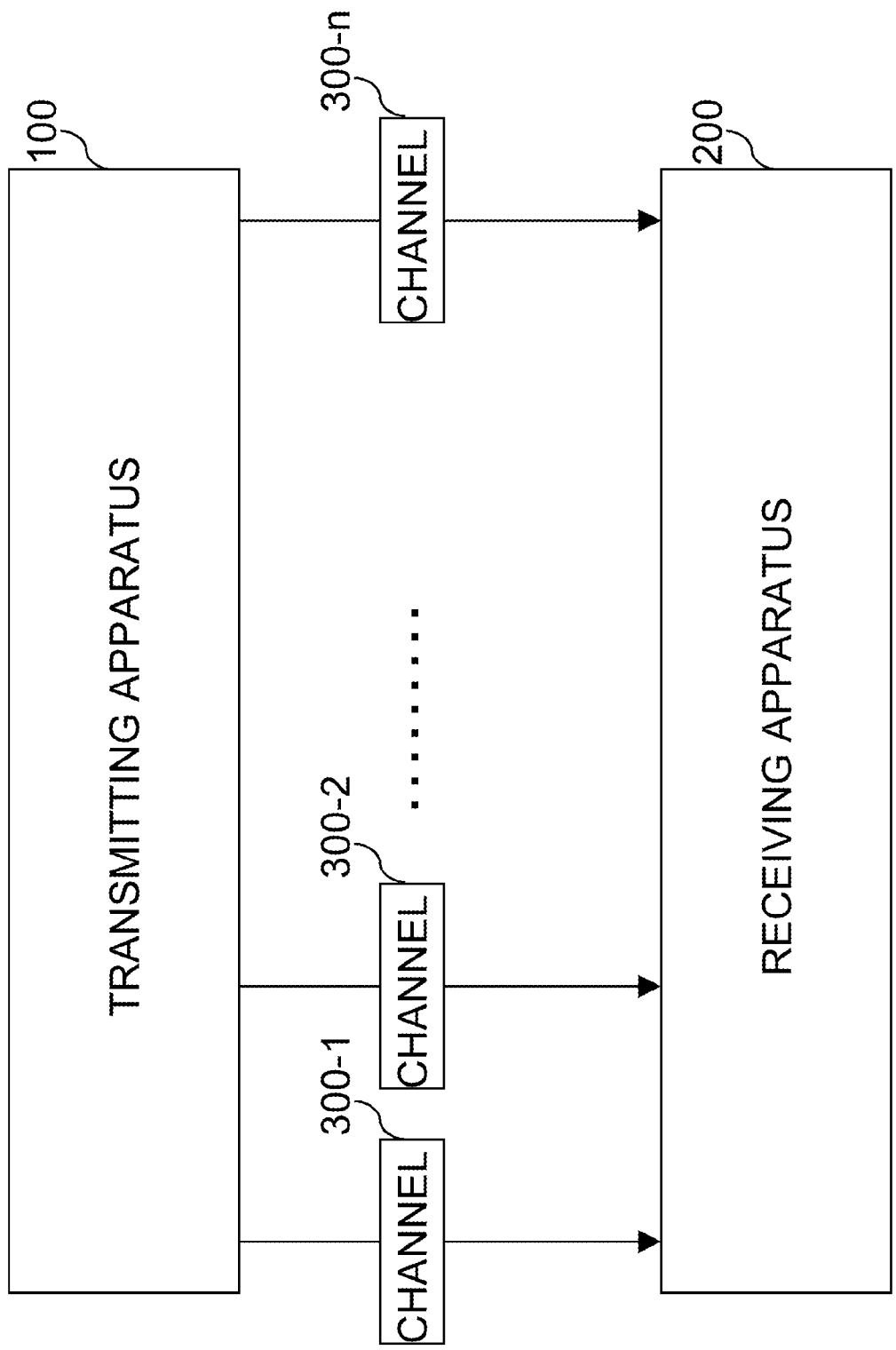
FIG. 1 is a block diagram showing the configuration of a message transmission system of the present preferred mode for carrying out the invention.

Preferred modes for carrying out the present invention will now be described in detail with reference to the drawings.

In an exemplary embodiment, a transmitting side of the message transmission system generates and transmits message codewords, the number of which is greater than or equal to 3t+1, where t is a presumed number of faulty channels. The message codewords, the number of which is greater than or equal to 3t+1, is such a number that the information regarding the message may not be obtained from a number of the coded messages which is less than or equal to t, and that the message may be decoded even in the absence of the t number of the coded messages. The transmitting side also generates and transmits a plurality of faulty encoded message identifying data capable of detecting t or less number of faulty codewords out of the multiple message codewords, even though t or less number of the codewords are faulty.

A receiving side of the message transmission system receives the message codewords, generated as described above, and the faulty encoded message identifying data corresponding thereto. The receiving side determines, using the message codewords and the faulty encoded message identifying data, generated as described above, whether or not the respective message codewords are faulty message codewords. The receiving side then decides whether or not the total of the message codewords, not decided to be faulty coded message information data, are the same message codewords. If the total of the message codewords, not decided to be faulty coded message information data, are the same message codewords, the message in question is output. If otherwise, the receiving side transmits an output to the effect that it has failed in receiving the message in question.

As the above mentioned message encoding method, an encoding technique, known as (a, b, c) threshold value method, may be used.

In this encoding method, the information data is encoded in c number of the distributed information. This encoding method is featured by the fact that, while the secret information may completely be restored from a or more number of distributed information, the information data regarding the secret information cannot at all be obtained from up to a-b-1 number of the distributed information.

Even if the number up to a-b-1 of the distributed information is stolen, the secret information is not leaked, whereas, even if a number up to c-a number of shared information is destroyed, the secret information can be restored.

If, in such encoding technique, the number of the codewords is n, and $a = t+1$, $b = n-3t+1$ and $c = n$, the above mentioned condition is met.

Typical of the techniques of the (a, b, c) threshold value method is that disclosed in the Non-Patent Document 2.

In more detail, the message transmission system of the present invention is made up of a transmitting apparatus and a receiving apparatus interconnected by a number of channels n satisfying $n = 3t+d+1 (d \geq 0)$, where t is the presumed number of the faulty channels.

The transmitting apparatus generates values $Vi\_i$, where $i = 1, 2, \ldots, n$, with d' being such that $d \geq d' \geq 0$, obtained on encoding the message using the (2t+d'+1, d'+t, n) threshold value method. The transmitting apparatus also generates faulty channel identifying information data $A\_i$, where $i = 1, 2, \ldots, n$, in association with the n number of values $V\_i$, using these values $V\_i$ and a random polynomial of the degree t. The faulty channel identifying information data $A\_i$ allow for error detection and correction by the Reed-Solomon error correction process in case there are errors in the t or less number out of the n number of values of $V\_i$. The transmitting apparatus then transmits the values $Vi\_i$, where $i = 1, 2, \ldots, n$, and $A\_i$, where $i = 1, 2, \ldots, n$, over the channels $C\_i$, where $i = 1, 2, \ldots, n$.

The receiving apparatus receives the values $Vi\_i$, where $i = 1, 2, \ldots, n$, and $A\_i$, where $i = 1, 2, \ldots, n$, generated by the transmitting apparatus, over the channels $C\_i$, where $i = 1, 2, \ldots, n$. Then, using these values $Vi\_i$, where $i = 1, 2, \ldots, n$, and $A\_i$, where $i = 1, 2, \ldots, n$, the receiving apparatus executes the process for Reed-Solomon error correction to decide on whether or not the n values $V\_i$ are faulty. The receiving side then checks if those values $V\_i$ not decided to be faulty are all the codewords of the same message. In case these values $V\_i$ are all the codewords of the same message, the receiving side outputs the message. In case there are contained codeword or codewords for a different message, the receiving side outputs a symbol indicating failure in message reception.

According to the present invention, with the above mentioned configuration, the volume of the information sent over the respective channels may be made smaller than with the conventional system.

The foregoing is relevant to a case of using n number of channels. It is noted however that the means that implement the channels may be optional provided that the means used allow a plurality of data generated by a transmitting apparatus to be sent in fractional parts. That is, the number of channels does not have to be n.

The presumed number of the faulty channels denotes the maximum number of the sets of information data, which tolerates tampering or eavesdropping, out of the n number of sets of information data generated by the transmitting apparatus.

FIG. 1 shows a configuration of a message transmission system of an exemplary embodiment. Referring to FIG. 1, the message transmission system includes a transmitting apparatus 100, a receiving apparatus 200 and a plurality of channels 300-1 to 300-n.

The operation of the message transmission system has the following two phases:

One of them is a phase of encoding a message and transmitting the message encoded over a channel.

The other is a phase of decoding the message encoded and received from a channel.

In the phase of encoding the message and transmitting the message encoded over a channel, mainly the transmitting apparatus 100 is in operation. In the phase of decoding the message, encoded and received from a channel, mainly the receiving apparatus 200 is in operation.

In the phase of encoding a message and transmitting the so encoded message using a channel, the transmitting apparatus 100 first encodes the message in accordance with a presumed number of faulty channels, and the number of channels n, entered as parameters, to generate a plurality of encoded message information data. The transmitting apparatus transmits the multiple encoded message information data, also termed shared message information data, over respective different channels 300-1 to 300-n.

The transmitting apparatus 100 further generates faulty channel identifying information data for each encoded message information data, using the shared secret information data generated, and the presumed number of the faulty channels. The transmitting apparatus 100 transmits the so generated faulty channel identifying information data, using the channels 300-1 to 300-n over which the encoded message information data corresponding to the respective faulty channel identifying information data were sent.

The presumed number of the faulty channels means an upper limit number of presumed faulty channels. With the message transmission system of the present exemplary embodiment, the encoded message information data tampered may be identified if the number of the tampered encoded message information data is not in excess of the presumed number of the channels.

The faulty channel identifying information data is data that identifies the encoded information data that has been subjected to tampering.

Here, the case of tampering is shown as a typical instance. However, not only a case where the information data is intentionally tampered with, but also a case where the information data has changed to faulty data by some reason other than intentional tampering may, of course, be comprised within the scope of the present invention.

It is unnecessary that the shared message information is initially sent and the faulty channel identifying information data is subsequently sent. That is, the two information data may be generated in their entirety and sent at a time.

In the phase of decoding the message, encoded and received over a channel, the receiving apparatus 200 initially receives the encoded message information data and the faulty channel identifying information data over the channels 300-1 to 300-n. The receiving apparatus then executes the process for identifying the encoded message information data that has been subjected to tampering, using the encoded message information and the faulty channel identifying information data.

In the process for identifying the tampered encoded message information data, it is checked whether or not the information data has been subjected to tampering. In case there is any encoded information data that has been subjected to tampering, the encoded information data that has been subjected to tampering is identified.

The receiving apparatus 200 checks whether or not the total of the encoded message information data, detected to have been not tampered, is the same message encoded.

If the same message has been encoded, such message is output.

If otherwise, a symbol indicating failure in message reception is output.

Figure 2:
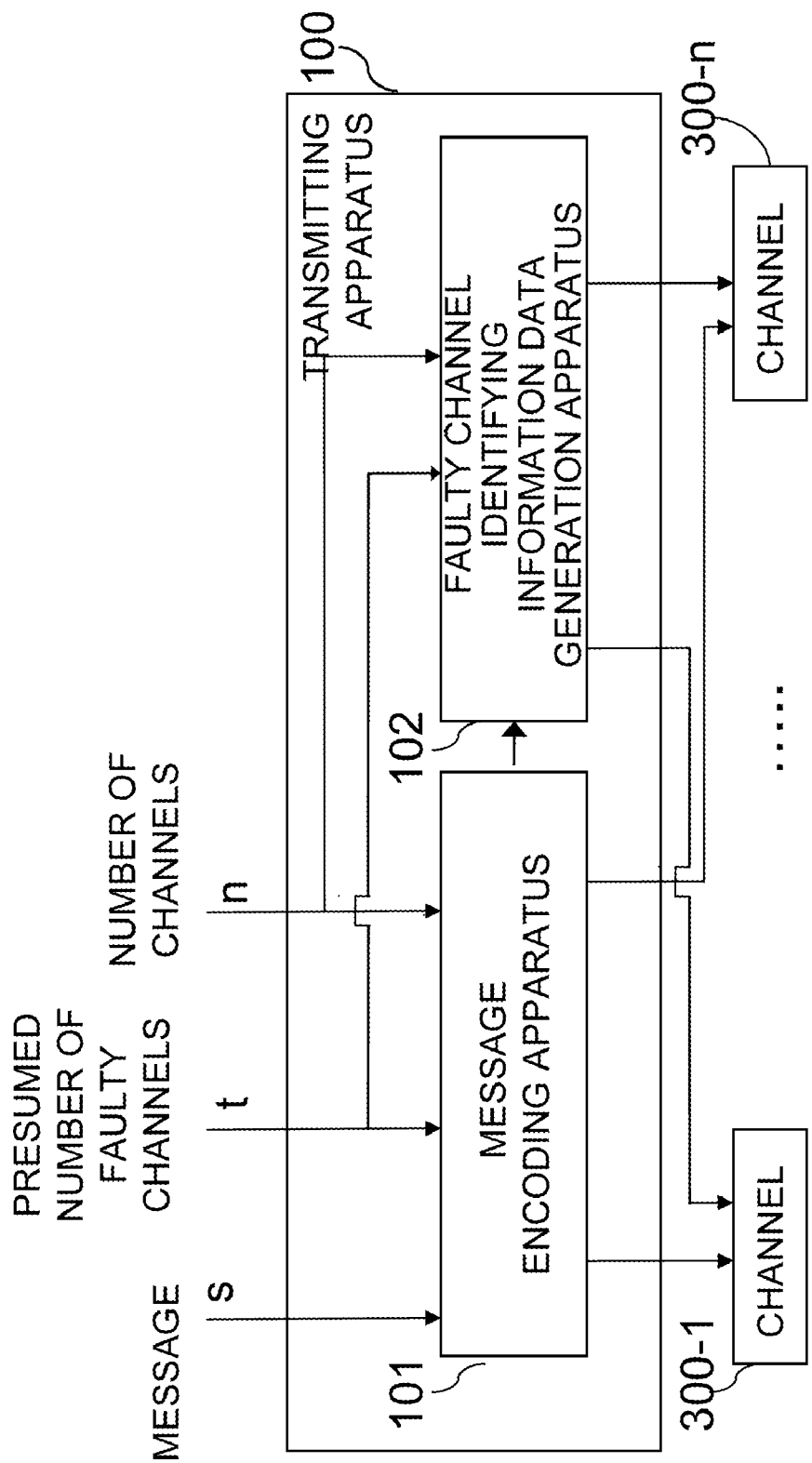
FIG. 2 is a block diagram showing the configuration of a transmitting apparatus 100.

FIG. 2 shows the configuration of the transmitting apparatus 100 of FIG. 1. Referring to FIG. 2, the transmitting apparatus 100 includes a message encoding apparatus 101 and a faulty channel identifying information data generation apparatus 102. A message s denotes an element of a set of particular messages.

The message s, presumed number of faulty channels t and the number n of channels are entered to the transmitting apparatus 100.

The message encoding apparatus 101 inputs the message s, presumed number of faulty channels t and the number n of channels, and generates codewords for the message (encoded message information data). These codewords for the message are generated so that the information regarding the message may not be obtained from t or less number of the codewords and so that the message may be decoded from the correct $2t+1$ or more codewords.

The faulty channel identifying information data generation apparatus 102 inputs the codewords, the presumed number of faulty channels t and the number n of channels to restore the message from the codewords. If, in restoring a message from the codewords, there are contained t or less number of faulty codewords, the faulty channel identifying information data generation apparatus generates faulty codeword identifying data that identifies the faulty codewords (listening adversary channel identifying information data A1 to An).

The message encoding apparatus 101 generates encoded message information data v1 to vn to send the information data over the channels 300-1 to 300-n.

The faulty channel identifying information data generation apparatus 102 generates the faulty channel identifying information data A1 to An to send them over the channels 300-1 to 300-n.

Figure 3:
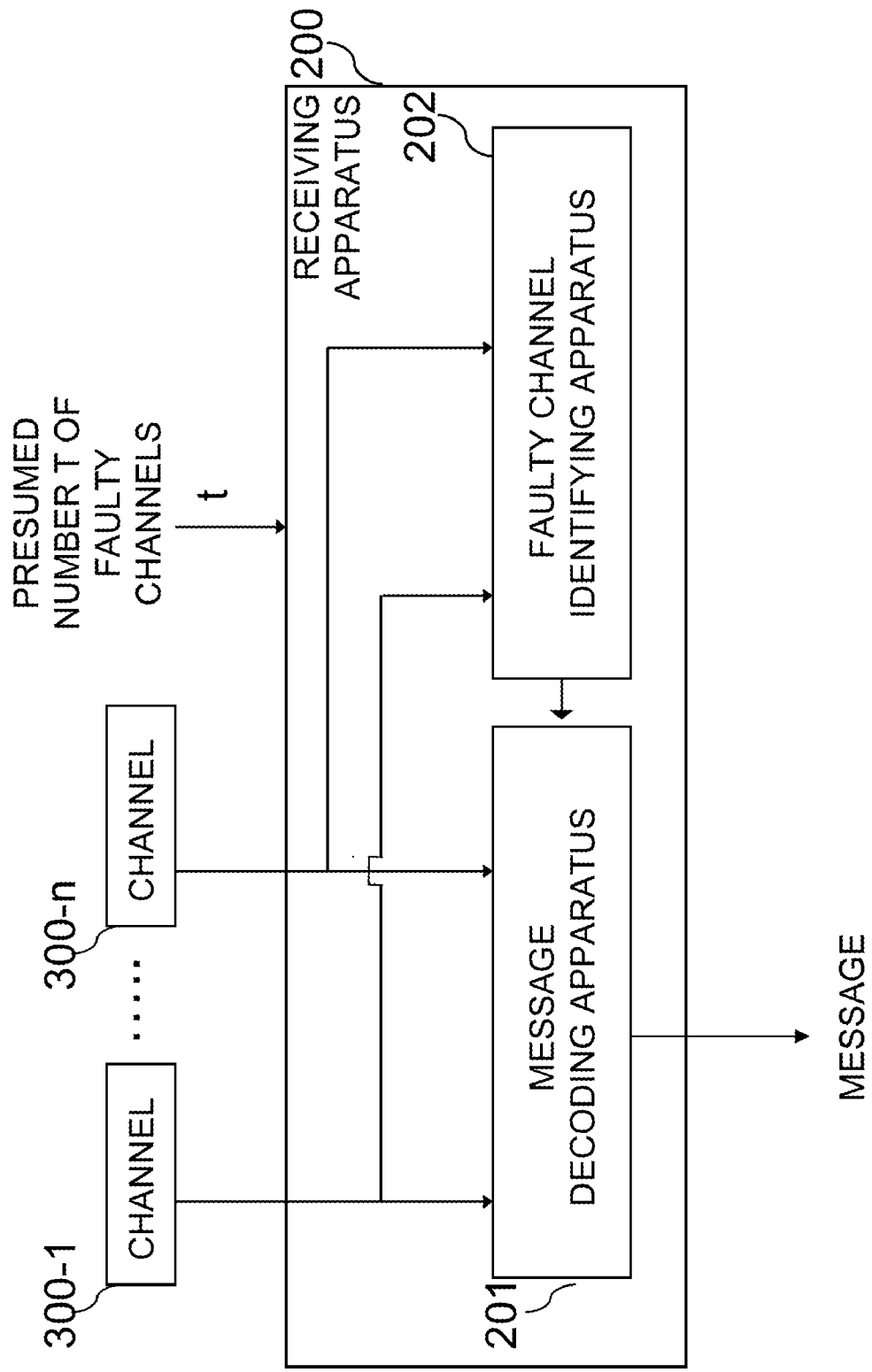
FIG. 3 is a block diagram showing the configuration of a receiving apparatus 200.

FIG. 3 depicts a block diagram showing the configuration of the receiving apparatus 200. Referring to FIG. 3, the receiving apparatus 200 includes a message decoding apparatus 201 and a faulty channel identifying apparatus 202.

The receiving apparatus 200 inputs the presumed number t of faulty channels, encoded message information data v1 to vn from the channels 300-1 to 300-n, and the faulty channel identifying information data A1 to An.

The receiving apparatus 200 receives the encoded message information data v1 to vn and the faulty channel identifying information data A1 to An, and executes the process for identifying the tampered encoded message information data.

The receiving apparatus checks to see whether or not the non-tampered encoded message information data are all the same message encoded. If it has been confirmed that the non-tampered encoded message information data are all the same message encoded, the message is output. If otherwise, a symbol indicating failure in reception is output.

The faulty channel identifying apparatus 202 receives the encoded message information data v1 to vn and the faulty channel identifying information data A1 to An from the channels 300-1 to 300-n, and executes the process for identifying the tampered encoded message information data.

In case tampering has been detected, the faulty channel identifying apparatus 202 transmits a set L of identifiers for the faulty channels, as elements, to the message decoding apparatus 201.

In case no tampering has been detected, the faulty channel identifying apparatus 202 delivers an empty set, indicating the absence of faulty channel, to the message decoding apparatus 201.

The message decoding apparatus 201 receives the encoded message information data v1 to vn from the channels 300-1 to 300-n, and checks to see if the encoded message information, not contained in the input set L from the faulty channel identifying apparatus 202, are all the codewords of the same message. If it has been confirmed that the encoded message information in its entirety is the same message encoded, the message is output. If otherwise, a symbol indicating failure in reception is output.

Figure 4:
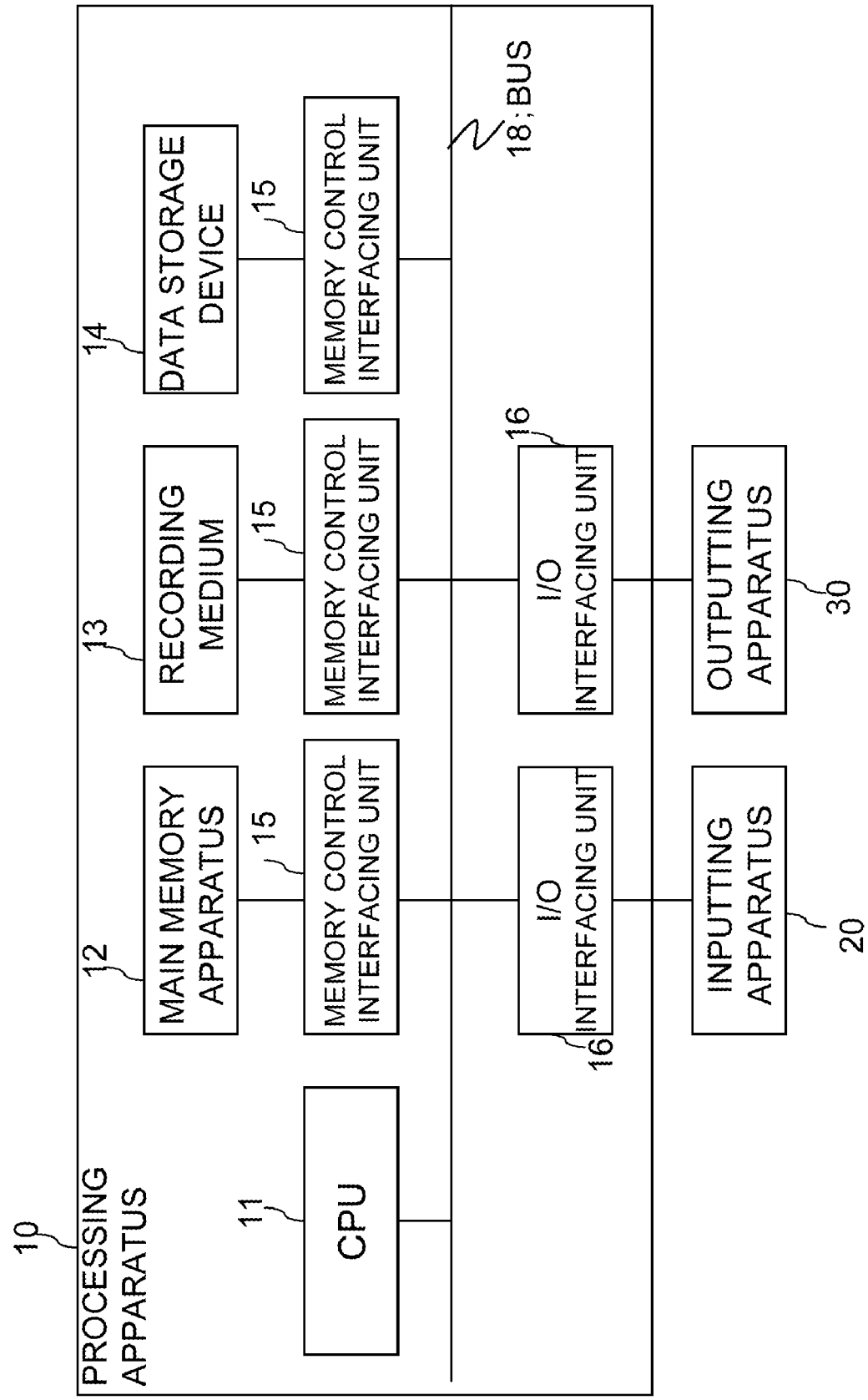
FIG. 4 is a block diagram showing the configuration of the transmitting apparatus 100 or the receiving apparatus 200

FIG. 4 depicts a block diagram showing the configuration of a computer that implements the transmitting apparatus 100 or the receiving apparatus 200. Referring to FIG. 4, the computer includes a processing apparatus 10, an inputting apparatus 20 and an outputting apparatus 30. The processing apparatus 10 executes preset processes in accordance with a program. The inputting apparatus 20 is used to enter a command or the information to the processing apparatus 10, and the outputting apparatus 30 monitors the result of the process by the processing apparatus 10. The processing apparatus 10 includes a CPU 11, a main memory apparatus 12, a recording medium 13, a data storage apparatus 14, a memory control interfacing unit 15 and an I/O interfacing unit 16. These component parts are interconnected over a bus 18. The CPU 11 is a processor for executing the program. The main memory apparatus 12 transiently stores the information necessary for the process by the CPU 11. The recording medium 13 has stored a program therein for execution by the CPU 11.

The data storage apparatus 14 retains the secret information and the access configuration data. The memory control interfacing unit 15 controls data write in and data readout from the main memory apparatus 12, the recording medium 13 and the data storage apparatus 14. The I/O interfacing unit 16 controls the data input/output with respect to the inputting apparatus 20 and the outputting apparatus 30. Using this interfacing unit, data is sent or received over the channel 300. The recording medium 13 may be a magnetic disc, a semiconductor memory, an optical disc or the like recording medium.

Figure 5:
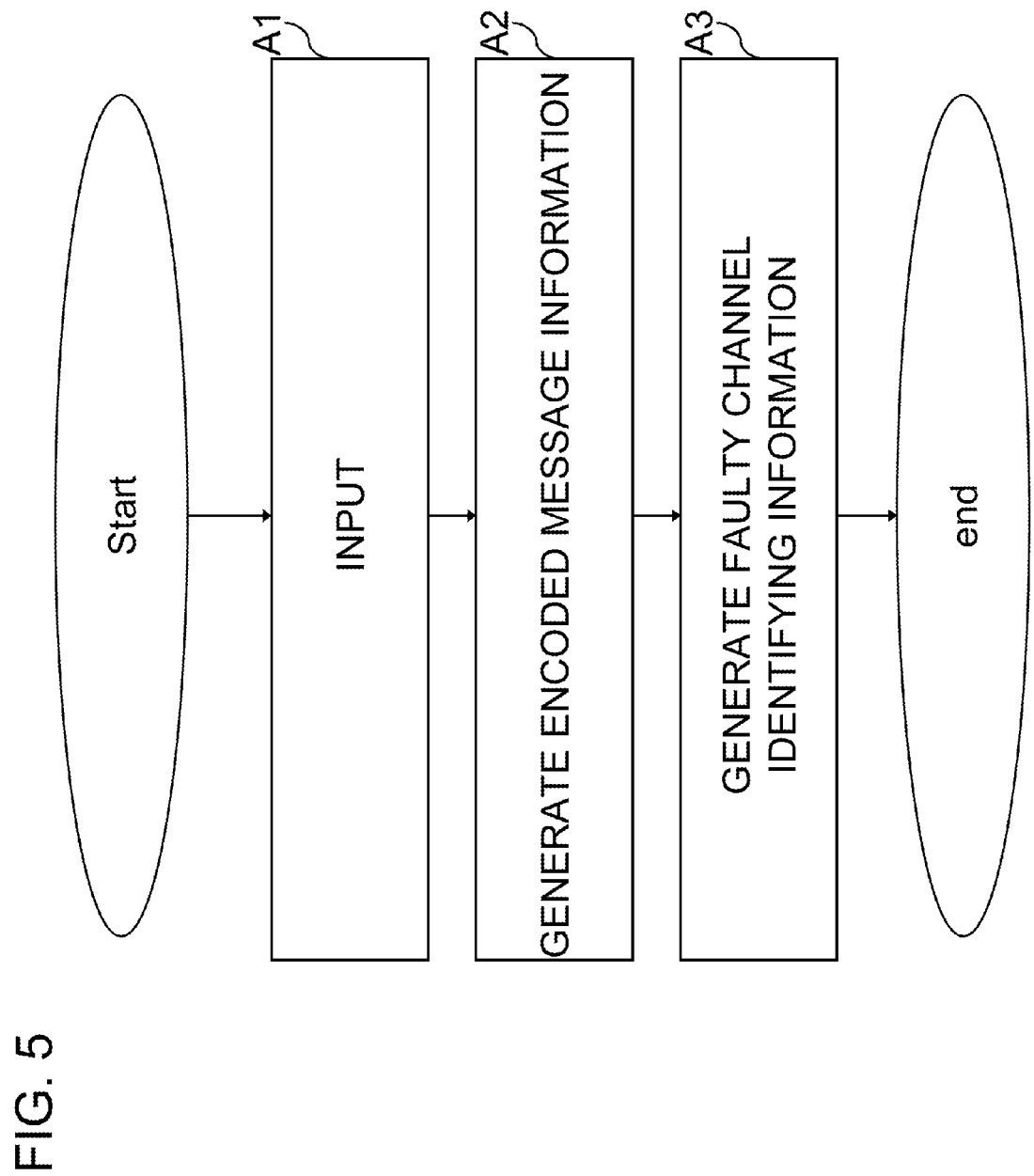
FIG. 5 is a flowchart for illustrating the operation of the transmitting apparatus 100.

FIG. 5 is a flowchart for illustrating the operation of the transmitting apparatus 100 in the exemplary embodiment.

Referring to FIG. 5, the message s, the presumed number t of faulty channels and the number n of the channels are entered to the transmitting apparatus 100 (step A1).

In the transmitting apparatus 100, the message encoding apparatus 101 executes the process for message encoding, using the message s, the presumed number t of faulty channels and the number n of the channels to generate n number of the encoded message information data v1 to vn. These information data are entered to the channels 300-1 to 300-$n$ and to the faulty channel identifying information data generation apparatus 102 (step A2).

Then, using the presumed number of faulty channels t and the number n of the channels, thus entered, and the encoded message information data v1 to vn, generated by the message encoding apparatus 101, the faulty channel identifying information data generation apparatus 102 generates the faulty channel identifying information data A1 to An respectively associated with the encoded message information data v1 to vn. The so generated faulty channel identifying information data are supplied to the channels 300-1 to 300-$n$ (step A3).

Figure 6:
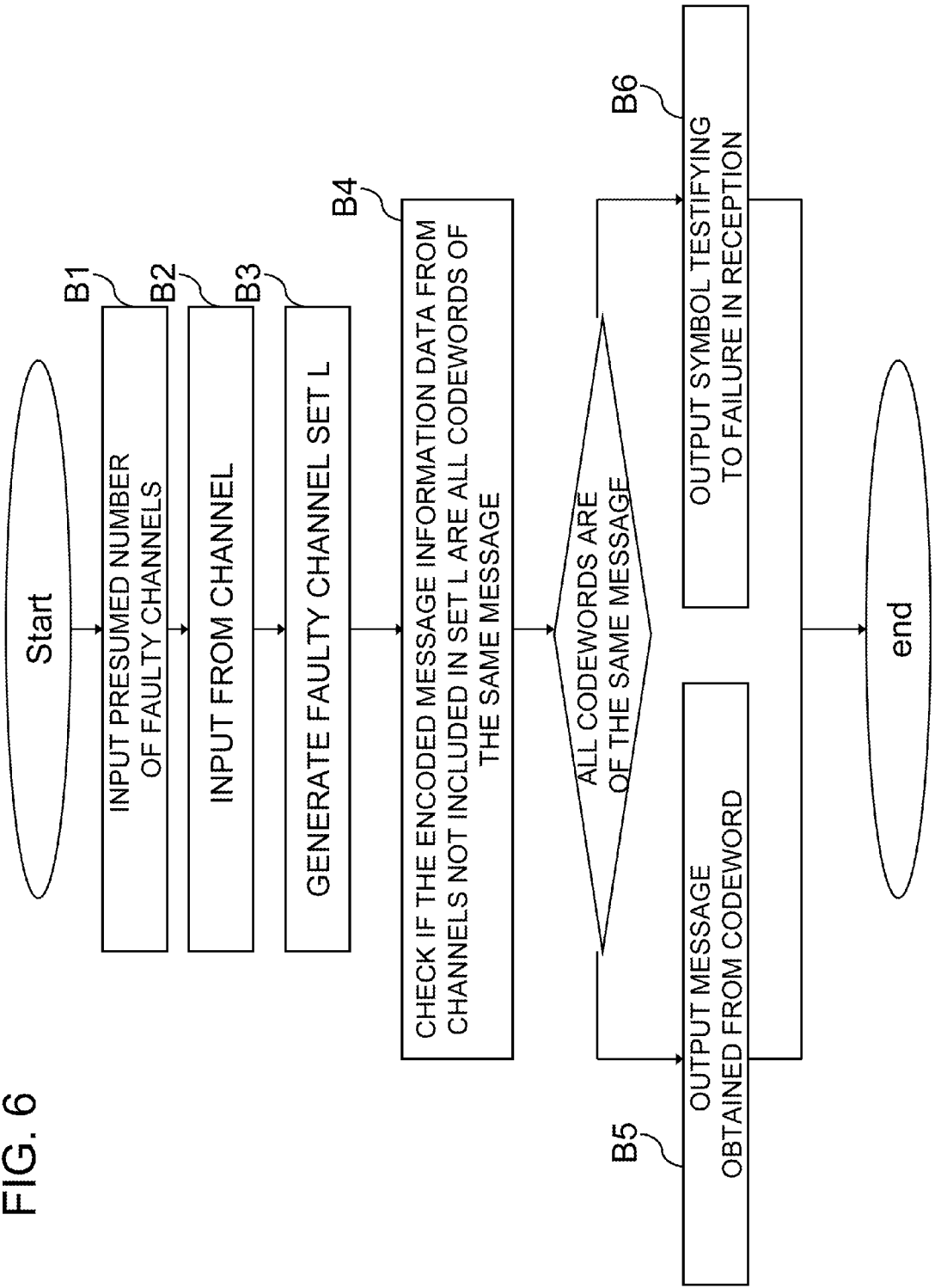
FIG. 6 is a flowchart for illustrating the operation of the receiving apparatus 200.

FIG. 6 depicts a flowchart for illustrating the operation of the receiving apparatus 200 of the exemplary embodiment. Referring to FIG. 6, the presumed number t of faulty channels is first entered to the receiving apparatus 200 (step B1).

The receiving apparatus 200 then reads out the faulty channel identifying information data A1 to An and the encoded message information data v1 to vn from the channels 300-1 to 300-$n$ (step B2).

Using the faulty channel identifying information data, respective encoded information data and the presumed number t of faulty channels, the faulty channel identifying apparatus 202 of the receiving apparatus 200 generates the set L (step B3). The set L has identifiers of the faulty channels as its elements.

The message decoding apparatus 201 then checks whether or not the encoded message information data, received from the channels whose identifiers are not contained in the set L, are all the encoded information data of the same message (step B4).

If it has been confirmed that the total of the input encoded message information data is the encoded information data of the same message, the message decoding apparatus 201 outputs the message (step B5).

If it has not been confirmed that the total of the input encoded message information data is the encoded information data of the same message, the message decoding apparatus 201 outputs a symbol indicating failure in message reception (step B6). The present invention will now be described with reference to exemplary embodiments.

Exemplary Embodiment 1

The system configuration of a first exemplary embodiment is the same as the exemplary embodiment described above with reference to FIGS. 1 to 3.

It is assumed that $$n \geq 3*t+1$$

where n denotes the number of the channels and t the presumed number of faulty channels, is valid.

It is also assumed that $$n = 3t+d+1$$

and that d' is such that $$d \geq d' \geq 0.$$

A message transmission system of the first exemplary embodiment uses $GF(p^{\{d'+t+1\}})$ as a set of message data. It is noted that p denotes a power of a prime number and may also be a prime itself.

$GF(p^{\{d'+t+1\}})$ is a finite field for a power of a prime number p. The addition, subtraction, multiplication, subtraction and power multiplication are denoted by $+, -, *, /$ and $\char`\^$, respectively.

The message encoding apparatus 101 of the first exemplary embodiment (see FIG. 1) applies shared encoding to the secret information, using the (2t+d'+1, t+d' and n) threshold value method described in Non-Patent Document 3.

The message decoding apparatus 201 restores the message using a decoding method corresponding to the (2t+d'+1, t+d' and n) threshold value method.

At this time, the message encoded is an element of the set of data $GF(p)$.

The transmitting apparatus 100 and the receiving apparatus 200 (see FIG. 1) of the first exemplary embodiment will now be described.

The transmitting apparatus 100 of the first exemplary embodiment inputs the message s, presumed number t of faulty channels (presumed number of listening adversaries) and the total number n of the distributed information (number of channels).

The message s, as element of $GF(p^{\{d'+t+1\}})$, may be expressed on $GF(p)$ as $$(s\_1, \ldots, s\{d'+t+1\}).$$

In the transmission apparatus 100, the message encoding apparatus 101 (see FIG. 1) randomly generates a polynomial of the degree 2t+d' in which coefficients up to the term of the (d'+t) degree from the constant term on $GF(p)$ are $s\_1, \ldots,$ and $s\_\{d'+t+1\}$). This polynomial of the degree (2t+d') is denoted as $fs(x)$.

The message encoding apparatus 101 calculates $fs(1)$, $fs(2), \ldots,$ and $fs(n)$. The results of calculation-input i pairs, That is, $$Vi = (i, vi),$$

where i=1, 2, . . . , n, vi=fs(i)) are supplied as the encoded message information data to the channels 300-$i$, where i=1, 2, . . . , n.

Figure 7:
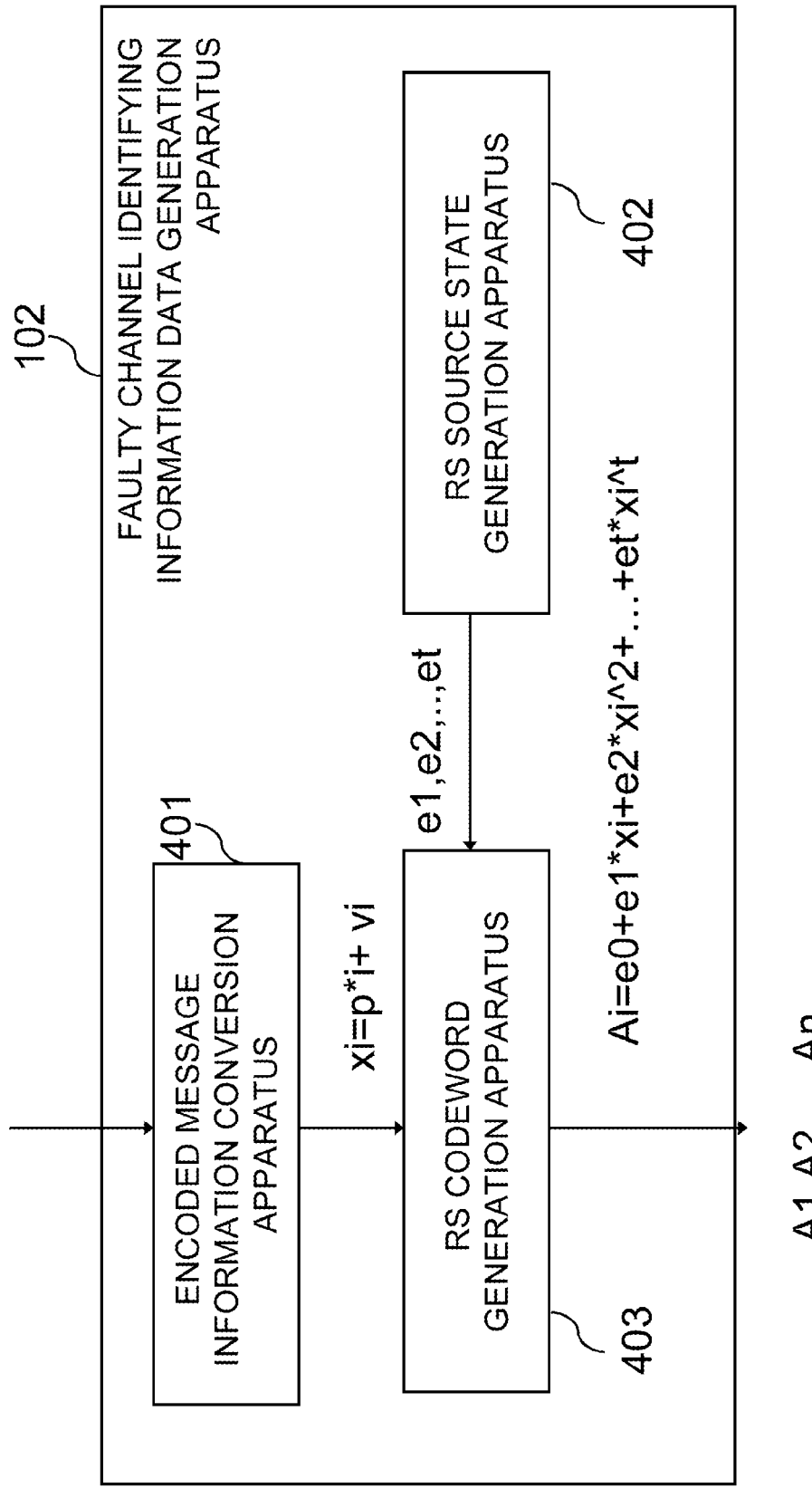
FIG. 7 is a block diagram for illustrating the configuration of a faulty channel identifying information data generation apparatus 102 in a first exemplary embodiment.

FIG. 7 depicts a block diagram showing a configuration of faulty channel identifying information data generation apparatus 102 of a first exemplary embodiment. Referring to FIG. 7, the faulty channel identifying information data generation apparatus 102 includes an encoded message information converter 401, an RS (Reed Solomon) source state generation apparatus 402 and an RS codeword generation apparatus 403.

The encoded message information converter 401 acquires $$Vi=(i,vi)$$

output from the message encoding apparatus 101, and calculates $$xi=p*(i-1)+vi,$$

where i=1, 2, . . . , n, for such q that $$q \geq n*p,$$

on the finite field GF(q) to output the result to the RS codeword generation apparatus 403.

The RS source state generation apparatus 402 generates random data e0, e1, . . . , and et, on the finite field GF(q), and outputs the result to the RS codeword generation apparatus 403.

The RS codeword generation apparatus 403 acquires xi, where i=1, 2, . . . , n, output from the encoded message information converter 401, and e0, e1, . . . , et, output from the RS source state generation apparatus 402. The RS codeword generation apparatus calculates, on the finite field GF(q), $$Ai=e0+e1*xi+e2*xi^2+\ldots+et*xi^t,$$

where i=1, 2, . . . , n and transmits the result over channels 300-$i$, where i=1, 2, . . . , n.

The so output A1, A2, . . . , An become the faulty channel identifying information data of the first exemplary embodiment.

A presumed number t of faulty channels is entered to the receiving apparatus 200 of the first exemplary embodiment (see FIG. 2).

The receiving apparatus 200 inputs Vi=(i, vi) and Ai, where i=1, 2, . . . , n, from the channels 300-1, 300-2, . . . , 300-$n$.

The (A1, A2, . . . , An), thus acquired, represent the codewords of the Reed-Solomon error correction code having the outputs e0, e1, . . . and et of the RS source state generation apparatus 402 as the source states.

From the presupposition, n≥3t+1 holds. It is thus possible to correct t number of errors contained in Ai to restore the original source states e0, e1, . . . and et.

In the receiving apparatus 200, Vi=(i, vi) and Ai, where i=1, 2, . . . , n are entered to the faulty channel identifying apparatus 202.

Figure 8:
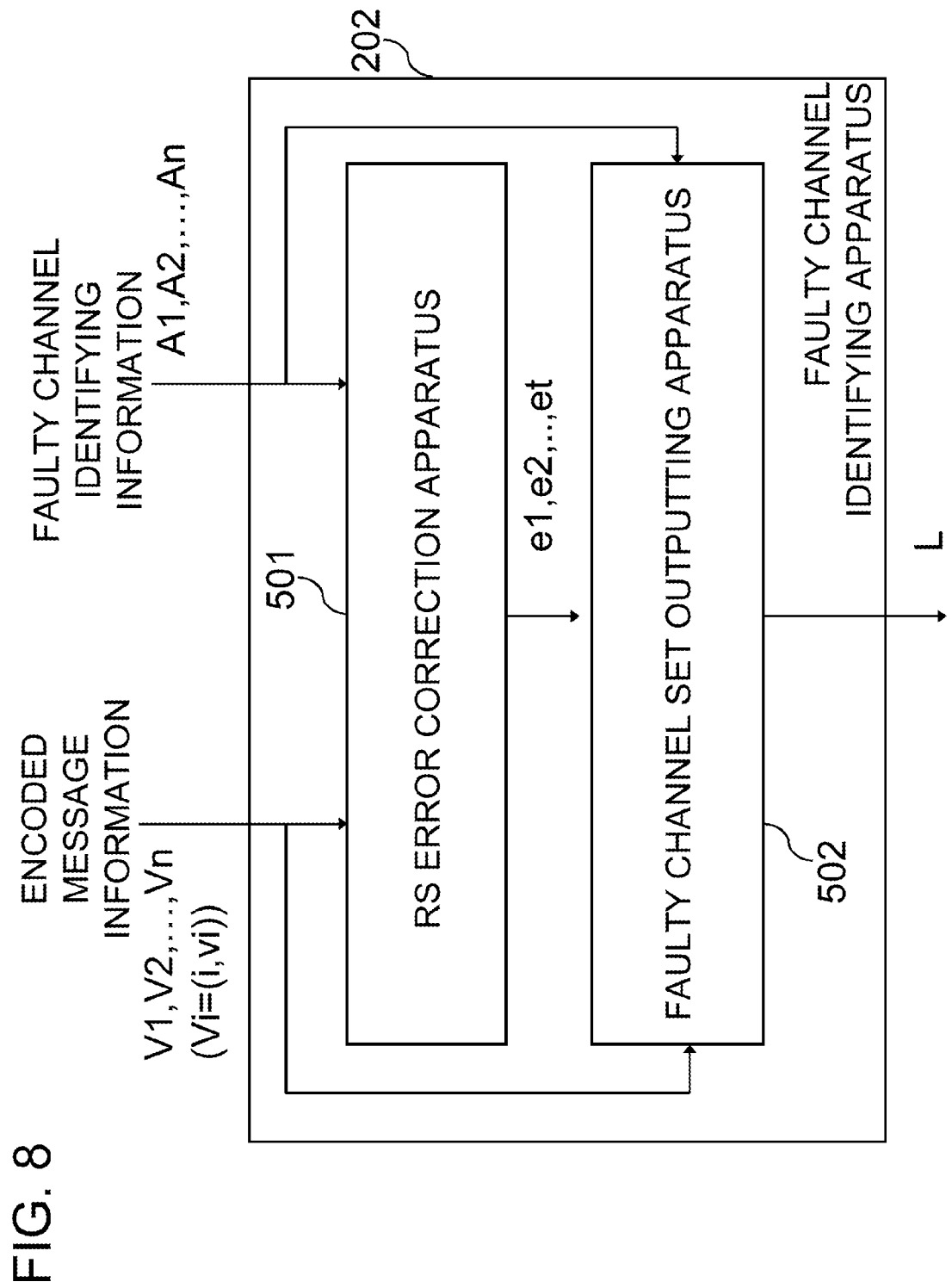
FIG. 8 is a block diagram for illustrating the configuration of a faulty channel identifying apparatus 202 in the first exemplary embodiment.

FIG. 8 depicts a block diagram showing the configuration of the faulty channel identifying apparatus 202 of the first exemplary embodiment. Referring to FIG. 8, the faulty channel identifying apparatus 202 includes an RS error correction apparatus 501 and a faulty channel set outputting apparatus 502.

The RS error correction apparatus 501 executes the process for Reed Solomon error correction, using the data Vi (i, vi) and the data Ai, where i=1, 2, . . . , n, to restore e0, e1, . . . , et, which are output to the faulty channel set outputting apparatus 502. The outputs e0, e1, . . . , et are the same as those generated by the RS source state generation apparatus 402 of the faulty channel identifying information data generation apparatus 102. It is noted that known methods for Reed Solomon error may be used. As an example of the known Reed Solomon error correction process, there is a Berlekamp method.

Vi (i, vi) and Ai, where i=1, . . . , n are entered to the faulty channel set outputting apparatus 502.

Using the data acquired, the faulty channel set outputting apparatus 502 calculates $$xi=p*(i-1)+vi,$$

where i=1, 2, . . . , n. A set L of i, for which $$Ai=e0+e1*xi+e2*xi^2+\ldots+et*xi^t$$

does not hold, is sent to the message decoding apparatus 201 as being a list of faulty channels.

The message decoding apparatus 201 acquires the set L (list of faulty channels) from the faulty channel identifying apparatus 202 to check to see if Vi, whose i's are not included in the set L, are the codewords of the same message.

If it has been confirmed that all Vi's are the codewords of the same message, the message decoding apparatus 201 outputs the message. If otherwise, the message decoding apparatus 201 outputs a symbol indicating failure in reception.

In the message decoding process, any suitable known methods may be used as a method for restoring the message. Examples of the known methods include a method for solving a simultaneous equation and a method employing Lagrange interpolation.

With the first exemplary embodiment, described above, the message encoding apparatus 101 in the transmitting apparatus 100 generates n number of encoded message information data Vi, where i=1, 2, . . . , n, by the (2t+d'+1, t+d', n) threshold value method.

The faulty channel identifying information data generation apparatus 102 generates the faulty channel identifying information data A1 to An, where i=1, 2, . . . , n for the respective message information data Vi, using the n number of the encoded message information data Vi, generated by the message encoding apparatus 101, and also using the polynomial of the degree t.

The faulty channel identifying information data generation apparatus 102 generates the faulty channel identifying information data that allows for error detection and correction by a Reed-Solomon error correction process in case there are errors in t or less encoded message information data out of the encoded message information data Vi, where i=1, 2, . . . , n.

The faulty channel identifying apparatus 202 in the receiving apparatus 200 performs the process for Reed-Solomon error correction, using the encoded message information data Vi, where i=1, 2, . . . , n, and the corresponding faulty channel identifying information data. The faulty channel identifying apparatus 202 outputs a set L of symbols indicating the incorrect shared secret information data, That is, a set from the faulty channel identifying apparatus 202 (list of faulty channels).

If it has been confirmed that all of the encoded message information data Vi, for which an error has not been detected by the Reed Solomon error correction process by the faulty channel identifying apparatus 202, are the same encoded message information data, the message decoding apparatus 201 outputs the message. Otherwise, the message decoding apparatus outputs a symbol indicating failure in message reception. In the first exemplary embodiment, the message is embedded in the coefficients of the polynomial. The information embedded in the coefficients of the polynomial may be found by, for example, a method of solving a simultaneous equation.

In this manner, the faulty channel identifying information data is generated by generating the faulty channel identifying information data that enables error detection and correction by the process for Reed-Solomon error correction using the encoded message information data Vi and the random polynomial of the degree t. By so doing, the size of the data sent over respective channels of the message transmission system, which renders it possible to identify the tampered encoded message information data, may be made smaller than that with the conventional system.

Also, in the first exemplary embodiment, the values xi, where i=1, 2, . . . , n, uniquely derived from the respective encoded information data Vi, where i=1, 2, . . . , n, are tampered into the random polynomial of the degree t. The values obtained are used as the faulty channel identifying information data Ai for the respective information data Vi.

It is noted that, when xi is generated from the encoded message information data Vi and i so that, if, for optional vi and vj, xi≠xj is valid in case vi≠vj, $$xi=p*(i-1)+vi,$$

where i=1, 2, . . . , n,
is calculated on GF(q) for q such that q≦n*p.

In the first exemplary embodiment, in which the size of the encoded message information data is p, the size of the set corresponding to the encoded message information data and the faulty channel identifying information data, combined together, is p*q.

The probability that the tampered encoded information data is output as an element of the set L, That is, the probability of detection of tampering, is 1−1/q.

In the system disclosed in Non-Patent Document 1, the data size sent over each channel is $$p\hat{\,}\{(d'+t+1)-d'\},$$

That is, $$p\hat{\,}\{t+1\}.$$

Since q is n times as large as p at most, the size of data sent over each channel in the present Example becomes smaller as t becomes larger.

In the present Example, the Reed-Solomon error correction process is used as a method that corrects the error of the faulty channel identifying information data. However, any other suitable method may be used provided that such method allows for positive error correction.

Exemplary Embodiment 2

In a second exemplary embodiment, it is assumed that $$n≧3*t+1$$

where n denotes the number of the channels and t denotes the presumed number of the faulty channels, is valid.

It is also assumed that $$n=3t+d+1$$

and d' is such that $$d≧d'≧0.$$

The system of the second exemplary embodiment uses a finite field GF(p^(N*(t+d'+1))) as a set of data of the secret information.

It is to be noted that p is the prime power which is the same as that used in the first exemplary embodiment.

As in the first exemplary embodiment, addition, subtraction, multiplication, division and power multiplication are denoted by +, −, *, / and ^, respectively.

As in the first exemplary embodiment, the message encoding apparatus 101 of the second exemplary embodiment (see FIG. 1) encodes a message using the (2t+d'+1, t+d', n) threshold value method stated in Non-Patent Document 3.

The message decoding apparatus 201 (see FIG. 3) decodes a message using a decoding method corresponding to the (2t+d'+1, t+d', n) threshold value method stated in Non-Patent Document 3.

The transmitting apparatus 100 and the receiving apparatus 200 of the second exemplary embodiment will now be described.

The transmitting apparatus 100 of the second exemplary embodiment inputs the message s, the number n of the channels and the presumed number t of faulty channels.

The message s, as an element of GF(p^(N*(d'+t+1))), may be expressed by $$(s\_1, \ldots, s\_\{d'+t+1\})$$

as the elements of GF(p^N).

When the transmitting apparatus 100 has input the message s, number n of channels and the presumed number t of faulty channels, its message encoding apparatus 101 randomly generates a polynomial of the degree 2t+d' whose coefficients from the constant term to the term of the degree d'+t on GF(p^N) are $$s-1, \ldots, \text{and } s\_\{d'+t+1\}.$$

This polynomial of the degree 2t+d' is denoted by fs(x).

The message encoding apparatus 101 calculates fs(1), fs(2), . . . , and fs(n), and the results of calculations fs(i)-input i pairs:

$$Vi=(i,Vi),$$

where i=1, 2, . . . , n, and vi=fs(i))
are supplied as the encoded message information to the channels 300-i, where i=1, 2, . . . , n.

The encoded message information data vi, as the elements of GF(p^N), may be expressed as $$(v\{i,0\}, \ldots, v\{i,N-1\}),$$

in terms of the elements of the GF(p).

Figure 9:
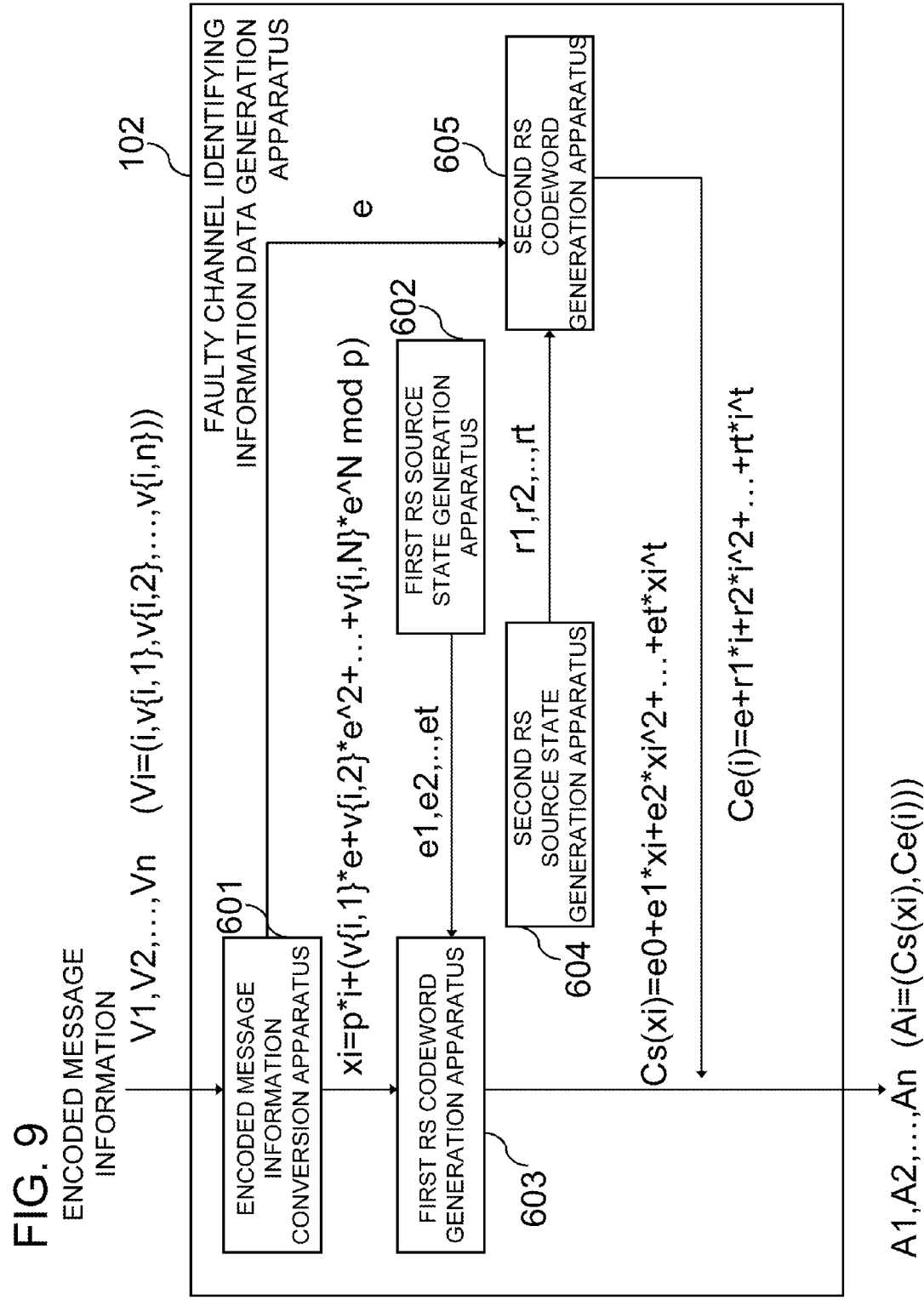
FIG. 9 is a block diagram for illustrating the configuration of a faulty channel identifying information data generation apparatus 102 in a second exemplary embodiment.

FIG. 9 depicts a block diagram showing the configuration of the faulty channel identifying information data generation apparatus 102 of the second exemplary embodiment. Referring to FIG. 9, the faulty channel identifying information data generation apparatus 102 includes an encoded message information converter 601, a first RS source state generation apparatus 602, a first RS codeword generation apparatus 603, a second RS source state generation apparatus 604 and a second RS codeword generation apparatus 605.

When the faulty channel identifying information data generation apparatus 102 inputs the number of channels n and the presumed number t of faulty channels, the encoded message information converter 601 acquires Vi=(i, v{i, 0}, . . . , v{i, N−1}, where i=1, . . . , n, output from the message encoding apparatus 101. The encoded message information converter 601 randomly acquires e on GF(p) to output it to the second RS codeword generation apparatus 605.

The encoded message information converter 601 also calculates $$yi=v\{i,0\}+v\{i,1\}*e+v\{1,2\}*e\hat{\,}2+\ldots+v\{i,N-1\}*e\hat{\,}\{N-1\},$$

where i=1, 2, ..., n,
on GF(p).

The encoded message information converter 601 then calculates, for q such that q≧n:p, $$xi=p*(i-1)+yi,$$

where i=1, 2, ..., n,
on GF(q), and outputs the result to the first RS codeword generation apparatus 603.

The first RS source state generation apparatus 602 outputs random data e0, e1, ..., and et, on GF(q) to the first RS codeword generation apparatus 603.

The first RS codeword generation apparatus 603 acquires xi, where i=1, 2, ..., n, output from the encoded message information converter 601, and e0, e1, ..., and et, output from the first RS source state generation apparatus 602. The first RS codeword generation apparatus calculates $$Cs(Xi)=e0+e1*xi+e2*xi^2+\ldots+et*xi^t,$$

where i=1, 2, ..., n,
on GF(q), to output the result of the calculations.

The second RS source state generation apparatus 604 selects random data r1, ..., and rt on GF(p) to output the data selected to the second RS codeword generation apparatus 605.

The second RS codeword generation apparatus 605 acquires e output from the encoded message information converter 601 and r1, ..., and rt output from the second RS source state generation apparatus 604. The second RS codeword generation apparatus calculates $$Ce(xi)=e+r1*i+r2*i^2+\ldots+rt*i^t,$$

where i=1, 2, ..., n
to output the result of the calculations.

$$Ai=(Cs(xi),Ce(i)),$$

where i=1, 2, ..., n, composed of Cs(xi), where i=1, 2, ..., n, output from the first RS codeword generation apparatus 603, and Ce(i) output from the second RS codeword generation apparatus 605 becomes the faulty channel identifying information data corresponding to the coded message information data vi.

The faulty channel identifying information data A1, A2, ..., and An are respectively supplied to the channels 300-i, where i=1, 2, ..., n.

The presumed number t of faulty channels is supplied to the receiving apparatus 200 of the second exemplary embodiment.

The receiving apparatus 200 inputs Vi=(i, vi) and Ai, where i=1, 2, ..., n, from the channels 300-1, 300-2, ..., 300-n.

In $Ai=(Cs(x,i),Ce(i)),(Cs(xi),Cs(x2),\ldots,Cs(xn))$ represent codewords of the Reed-Solomon error correction code having e0, e1, ..., and et, output from the first RS source state generation apparatus 602, as source states.

Since n≧3t+1, it is possible to correct t number of errors contained in Cs(xi) to restore the original source states e0, e1, ..., and et.

In similar manner, (Ce(1), Ce(2), ..., Ce(n)) represent codewords of the Reed-Solomon error correction code having e, r1, r2, ..., and rt, as the source states, where e is an output of the encoded message information converter 601, and r1, ..., and rt are outputs of the second RS codeword generation apparatus 605.

Since n≧3t+1 is presupposed, it is possible to correct t number of errors contained in Ce(i) to restore the original source states e0, r1, ..., and rt.

In the receiving apparatus 200, Vi=(i, vi) and Ai, where i=1, ..., n, are supplied to the faulty channel set outputting apparatus 502 of the faulty channel identifying apparatus 202.

Figure 10:
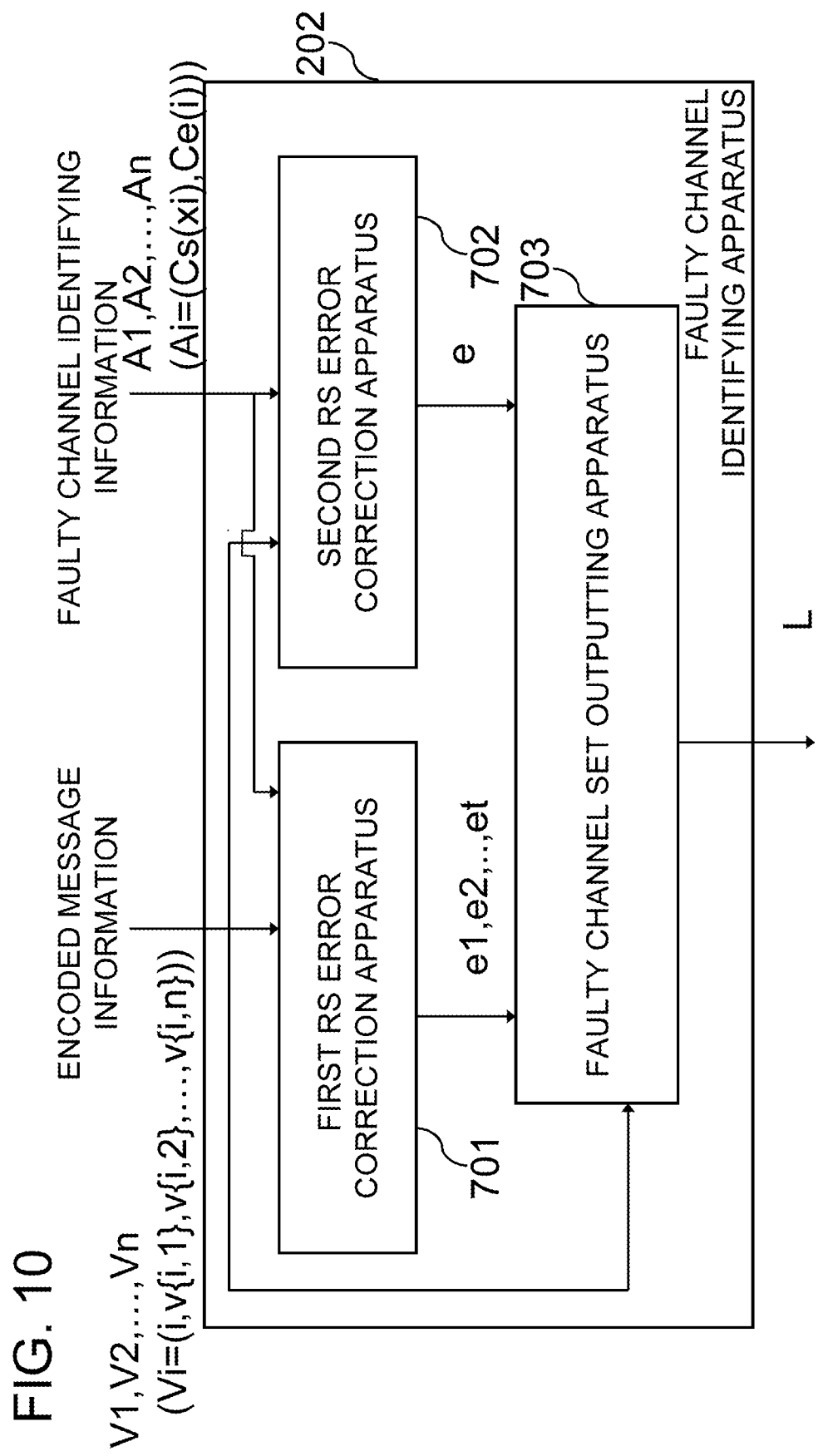
FIG. 10 is a block diagram for illustrating the configuration of a faulty channel identifying apparatus 202 in the second exemplary embodiment.

FIG. 10 depicts a block diagram showing a configuration of the faulty channel identifying apparatus 202 of the second exemplary embodiment. Referring to FIG. 10, the faulty channel identifying apparatus 202 includes a first RS error correction apparatus 701, a second RS error correction apparatus 702 and a faulty channel set identifying apparatus 703.

The first RS error correction apparatus 701 performs the Reed Solomon error correction process on the codewords (Cs(x1), ..., Cs(xn)) to restore e0, e1, ..., and et which are the same as those output by the first RS source state generation apparatus 602 of the faulty channel identifying information data generation apparatus 102. The first RS error correction apparatus outputs the so restored e0, e1, ..., et to the faulty channel set identifying apparatus 703.

The second RS error correction apparatus 702 performs the process for Reed-Solomon error correction on the codewords (Ce(1), ..., Ce(n)) to restore the same e as that output by the encoded message information converter 601 of the faulty channel identifying information data generation apparatus 102. The second RS error correction apparatus then outputs the so restored e to the faulty channel set identifying apparatus 703.

The faulty channel set identifying apparatus 703 inputs $$Vi=(i,vi) \text{ and } Ai=(Cs(xi),Ce(i)),$$

where i=1, 2, ..., n.

The faulty channel set identifying apparatus 703 calculates $$yi=v\{i,0\}+v\{i,1\}*e+v\{i,2\}*e^2+\ldots+v\{i,N-1\}e^{N-1}\},$$

where i=1, 2, ..., n,
on GF(p), while also calculating $$x\{i\_j\}=p*(i\_j-1)+yi,$$

where i=1, 2, ..., n,
on GF(q).

The faulty channel set identifying apparatus 703 then outputs a list L of i's, for which $$Ce(i)=e0+e1*x\{i\}+e2*x\{i\}^2+\ldots+et*x\{i\}^t$$

does not hold, as a list of listening adversaries.

This set (list of faulty channels) L is to be an output of the faulty channel identifying apparatus 202.

In case it has been confirmed that the total of the encoded message information data Vi, for which no error has been detected by the process for Reed-Solomon error correction by the faulty channel identifying apparatus 202, is the information of the same message encoded, the message decoding apparatus 201 outputs the message. If otherwise, the message decoding apparatus 201 outputs a symbol indicating failure in message reception.

In the present Example, e0, e1, ..., and et check whether or not a faulty value is contained in the values of the codewords of the message as the elements of GF(p^N) mapped to the elements of GF(p) by e. That is, e0, e1, ..., and et are data used for deciding whether or not a faulty value is contained in an output obtained on inputting the message codewords to a function represented by e.

On the other hand, such a function as $$yi=v\{i,0\}+v\{i,1\}*e+v\{i,2\}*e^2+\ldots+v\{i,N-1\}e^{N-1}\},$$

where i=1, 2, ..., n, having v{i, 0} as input, is a representation of a function termed a 'universal Hash function', as disclosed in Non-Patent Document 3.

The universal Hash function is such a function in which, despite the fact that t number of sets of input-output relationships for the universal Hash function, selected at random from the functions of the function group, has been made explicit, the probability that an input having the same output as that of an optionally selected input may be selected is sufficiently low.

That is, it does not matter that a listening adversary sees data sent over t number of channels. That is, the first RS codeword generation apparatus 603 and the second RS codeword generation apparatus 605 may be the to be a apparatus that encodes these data in an error correction enabling form.

In the present Example, a message is embedded in the coefficients of a polynomial. The information embedded in the coefficients of a polynomial may be found by, for example, solving simultaneous equations.

As described above, in the present the second exemplary embodiment, the values xi, where i=1, 2, . . . , n, uniquely derived from each encoded message information data Vi, where i=1, 2, . . . , n, and from randomly selected e, are found. The values of xi are then tampered into the random polynomial of the degree t to find Cs(xi). The values of i are tampered into the random polynomial (Ce(0)=e) to find Ce(i). The value composed of Cs(xi) and Ce(i) is set so as to be the faulty channel identifying information data Ai for respective values Vi.

At this time, $$yi = v\{i,0\} + v\{i,1\}*e + v\{i,2\}*e\hat{\ }2 + \ldots + v\{i,N-1\}e\hat{\ }\{N-1\},$$

where i=1, 2, . . . , n, is first calculated, using a random value of e, and $$xi = p*(i-1) + yi,$$

where i=1, 2, . . . , n, is then calculated, using yi, so that, if, for optional values of vi and vj, vii vj is valid, then xi≠xj will be valid to a sufficiently high probability.

In the present Example in which the size of the encoded message information data is PAN, the size of a set combined from the encoded message information data and the faulty channel information identifying information data, summed together, is $$p\hat{\ }\{N+1\}*q.$$

The probability that the tampered encoded message information data is output as being the element of the set L, That is, the probability that the tampering is detectable, is $$1 - N/p - 1/q.$$

In the system disclosed in Non-Patent Document 2, the size of data sent over respective channels is $$p\hat{\ }(N*(t+d'+1)-d').$$

Thus, in the present Example, the size of the data, sent over the respective channels, may be reduced appreciably.

In the first exemplary embodiment, there is placed a constraint $$q \geq n*p$$

between the size p of the encoded message information data and the probability of fault detection 1−1/q.

In the second exemplary embodiment, the constraint between the size of the encoded message information data and the probability of fault detection may be removed by properly selecting the value of p.

That is, it is possible to remove the constraint between the size of the message information data and the probability of fault detection.

In the description of the preferred mode for carrying out the present invention and Examples 1 and 2, the channels are used. However, means for implementing the channels may be of any suitable configuration provided that a plurality of data generated may be divided into different sections and these data sections may then be sent.

The particular exemplary embodiments or examples may be modified or adjusted within the gamut of the entire disclosure of the present invention, inclusive of claims, based on the fundamental technical concept of the invention. Further, a large variety of combinations or selections of the elements disclosed herein may be made within the framework of the claims. The present invention may encompass various modifications or corrections that may occur to those skilled in the art within the gamut of the entire disclosure of the present invention, inclusive of claim and the technical concept of the present invention.

The invention claimed is:

1. A transmitting apparatus connected to a receiving apparatus over n number of channels, n being given by $$n = 3t + d + 1 (d \geq 0)$$

where t is a presumed number of faulty channels, in accordance with an (a, b, c) threshold value method in which information data are encoded in c number of distributed information and, while secret information may completely be restored from a or more number of the distributed information, no information data regarding the secret information data can be obtained from up to a-b-1 number of the distributed information, the transmitting apparatus comprising:

a unit that generates, from a message, n number of encoded message information data Vi, where i=1, 2, . . . , n, using the (2t+d'+1, d'+t, n) threshold value method, in which a, b and c in the (a, b, c) threshold value method are set so as to be 2t+d'+1, d'+t, and n, respectively, and d' being such that d≧d'≧0, a unit that generates, using the n number of the encoded message information data Vi and a polynomial of the degree t, faulty channel identifying information data Ai in association with Vi, where i=1, 2, . . . , n, and transmits Vi and Ai, where i=1, 2, . . . , n, from respective corresponding channels, the faulty channel identifying information data enabling detection and correction of an error, if there is any, in t or less number of encoded message information data out of n number of the encoded message information data Vi, by a Reed-Solomon error correction process.

2. The transmitting apparatus according to claim 1, wherein a finite field GF(p^{d'+t+1}), where p is a power of a prime number or may also be a prime number itself, is used as a message data set, a message s, as an element of GF(p^{d'+t+1}), is represented as (s_1, . . . , s_{d'+t+1}) on GF(p);

a polynomial of the degree 2t+d', whose coefficients from a constant term up to the degree 2t+d' on GF(p) is randomly generated and set so as to be fs(x), fs(1), fs (2), . . . , and fs(n) are calculated, and Vi=(i, vi), pairs of the calculation result and input i, where i=1, 2, . . . , n and vi=fs(1), are output as the encoded message information data to the respective channels.

3. A receiving apparatus comprising:
a unit that receives, over respective channels, the encoded message information data Vi and the faulty channel identifying information data Ai, where i=1, 2, ..., n, generated by the transmitting apparatus of claim 1, over respective channels, and executes a Reed-Solomon error correction process using Vi and Ai, where i=1, 2, ..., n, to decide whether or not each of the n number of Vi is of a faulty value; and
a unit that checks whether or not Vi not decided to be faulty are all codewords of the same message and that outputs the message in case Vi not decided to be faulty are all codewords of the same message and outputs a symbol indicating failure in message reception in case a codeword of a different message is contained in Vi not decided to be faulty.

4. The transmitting apparatus according to claim 1, further comprising:
a message encoding unit that, on receipt of a message s, the number of channels n and the presumed number t of faulty channels, randomly generates a polynomial of the degree 2t+d' whose coefficients on GF(p^N) from a constant term to a d'+t'th term are s__1, ..., s_{d'+t+1}, sets the polynomial of the degree 2t+d' to fs(x),
calculates fs(1), fs(2), ..., and fs(n) and
generates pairs of the calculation result fs(i) and input i Vi=(i, vi), where i=1, 2, ..., n, and vi=fs(i), as encoded message information, provided that the encoded message information data vi is expressed as (v{i, 0}, ..., v{i, N−1}) in terms of elements of GF(p);
an encoded message information conversion unit that inputs the number of channels n, the presumed number t of faulty channels and Vi=(i, v{i, 0}, ..., v{i, N−1}, where i=1, 2, ..., n,
randomly selects e on GF(p),
calculates $$yi=v\{i,0\}+v\{i,1\}*e+v\{i,2\}*e^2+\ldots+v(i,N-1)e^\{N-1\},$$

where i=1, 2, ..., n, and
calculates $$xi=p*(i-1)+yi,$$

where i=1, 2, ..., n, on GF(q);
a Reed-Solomon source state generation unit that generates random data e0, e1, ..., and et, on GF(q);
a first Reed-Solomon codeword generation unit that calculates $$Cs(xi)=e0+e1*xi+e2*xi^2+\ldots+et*xi^t,$$

where i=1, ..., n
from xi, where i=1, ..., n, and e0, e1, ..., and et on GF(q);
a second source state generation unit that selects random data r1, ..., and rt, on GF(p); and
a second Reed-Solomon codeword generation unit that acquires e and r1, ..., and rt, on GF(p) and calculates $$Ce(xi)=e+ri*i+r2*i^2+\ldots+rt*i^t,$$

where i=1, ..., n, on GF(q); wherein
Ai=(Cs(xi), Ce(i)), composed of Cs(xi) and Ce(i), where i=1, ..., n, generates the faulty channel identifying information data corresponding to the encoded message information data vi and Ai and supplies the data to respective channels.

5. A receiving apparatus comprising:
a first Reed-Solomon error correction unit that receives, over channels, the encoded message information data Vi generated by the transmitting apparatus according to claim 4, and faulty channel identifying information data Ai (Cs(xi), Ce(i)), where i=1, 2, ..., n, associated with the encoded message information data, and
performs a Reed-Solomon error correction process on the codewords (Cs(xi), ..., Cs(xn)) to restore e0, e1, ..., and et;
a second Reed-Solomon error correction unit that performs a Reed-Solomon error correction process on the codewords (Ce(1), ..., Ce(n)) to restore e; and
a faulty channel identifying unit that calculates $$yi=v\{i,0\}+v\{i,1\}*e+v\{i,2\}*e^2+\ldots+v\{i,N-1\}e^\{N-1\},$$

where i=1, ..., n, on GF(p),
calculates $$x\{i\}=p*(i-1)+yi,$$

where i=1, 2, ..., n,
on GF (q), and
outputs a set L of i, for which $$Ce(i)=e0+e1*x\{i\}+e2*x\{i\}^2+\ldots+et*x\{i\}^t$$

is not valid, as being a list of faulty channels.

6. An encoder in which a presumed number of faulty channels is t and which outputs n number of codewords for a message m and n number of faulty codeword identifying data, the encoder comprising:
a message encoding unit that generates a polynomial F of the degree n−(t+1) in which the message is embedded, on a finite field, n number of the polynomials being generated with different points on each polynomial as codewords of the message; and
a faulty codeword identifying data generation unit that inputs the codewords for the message and generates a polynomial G of the degree t on a finite field, the faulty codeword identifying data generation unit processing the codewords of the message so that the codewords will be of different values over the finite field, and generating an output obtained on entering the processed values to the polynomial G of the degree t, as faulty codeword identifying data, in association with the codewords for the message;
the codewords for the message and the faulty codeword identifying data being output.

7. A decoder that inputs the codewords for the message and the faulty codeword identifying data, output from the encoder according to claim 6, the number of channels n and the presumed number t of faulty channels to output a message, the decoder comprising:
a faulty encoded message decision unit that performs error correction to the faulty codeword identifying data and that restores the polynomial of the degree t, in which the faulty codeword identifying data has been generated, by the faulty codeword identifying data that undergoes the error correction;
the faulty encoded message decision unit processing the total of the codewords for the message in the polynomial of the degree t restored, in the same way as in the encoder, deciding whether or not the values of the codewords processed, entered to the restored polynomial of the degree t, are equal to the faulty codeword identifying data associated with the codewords for the message before the processing; and outputting a list of the total of the codewords of the message decided to be equal; and
a message decoding unit that decides whether or not the total of the codewords of the message contained in the list output from the faulty encoded message decision unit is the codewords of the same message, the message decoding unit decoding the message from the codewords decided to be non-faulty and outputting the resulting message in case of decision that the total of the codewords of the message contained in the list is the codewords of the same message, the message decoding unit outputting a failure in decoding if otherwise.

8. A transmission system comprising an encoder and a decoder, wherein the encoder, in which a presumed number of faulty channels is t and which outputs n number of codewords for a message m and n number of faulty codeword identifying data, comprises:

a message encoding unit that generates a polynomial F of the degree n−(t+1) in which the message is embedded, on a finite field, n number of the polynomials being generated with different points on each polynomial as codewords of the message; and a faulty codeword identifying data generation unit that inputs the codewords for the message and generates a polynomial G of the degree t on a finite field, the faulty codeword identifying data generation unit processing the codewords of the message so that the codewords will be of different values over the finite field, and generating an output obtained on entering the processed values to the polynomial G of the degree t, as faulty codeword identifying data, in association with the codewords for the message;

the codewords for the message and the faulty codeword identifying data being output, and wherein the decoder, that inputs the codewords for the message and the faulty codeword identifying data, output from the encoder, the number of channels n and the presumed number t of faulty channels to output a message, comprises:

a faulty encoded message decision unit that performs error correction to the faulty codeword identifying data and that restores the polynomial of the degree t, in which the faulty codeword identifying data has been generated, by the faulty codeword identifying data that undergoes the error correction;

the faulty encoded message decision unit processing the total of the codewords for the message in the polynomial of the degree t restored, in the same way as in the encoder, deciding whether or not the values of the codewords processed, entered to the restored polynomial of the degree t, are equal to the faulty codeword identifying data associated with the codewords for the message before the processing; and outputting a list of the total of the codewords of the message decided to be equal; and a message decoding unit that decides whether or not the total of the codewords of the message contained in the list output from the faulty encoded message decision unit is the codewords of the same message, the message decoding unit decoding the message from the codewords decided to be non-faulty and outputting the resulting message in case of decision that the total of the codewords of the message contained in the list is the codewords of the same message, the message decoding unit outputting a failure in decoding if otherwise.

9. An encoding method in which, with a presumed number t of faulty channels, n number of codewords for a message m and n number of faulty codeword identifying data are output, the method comprising:

generating a polynomial of an n−(t+1) degree on a finite field, in which the message is embedded, and generating n number of the polynomials with the codewords for a message placed at different points on each polynomial;

generating a polynomial G of the degree t on a finite field, with the codeword for the message as an input, processing the codewords of the message so that the codewords will be of different values over the finite field, and generating an output obtained by entering the processed values to the polynomial G of the degree t as faulty codeword identifying data, in association with the codewords for the message; and outputting the codewords for the message and the faulty codeword identifying data.

10. A decoding method that inputs the codewords for the message and the faulty codeword identifying data, output from the encoder according to claim 9, the number of channels n and the presumed number t of faulty channels to output a message, the method comprising:

performing error correction to the faulty codeword identifying data and restoring the polynomial of the degree t, in which the faulty codeword identifying data has been generated, by the faulty codeword identifying data that undergoes the error correction;

processing the total of the codewords for the message in the polynomial of the degree t restored, in the same way as in the encoder; deciding whether or not the values of the codewords processed, entered to the restored polynomial of the degree t, are equal to the faulty codeword identifying data associated with the codewords for the message before the processing; and generating a list of the total of the codewords of the message decided to be equal;

deciding whether or not the total of the codewords of the message contained in the list is the codewords of the same message; and decoding the message from the codewords decided to be non-faulty and outputting the resulting message in case it has been decided that the total of the codewords of the message contained in the list is the codewords of the same message, and outputting a failure in decoding if otherwise.

11. A transmission method comprising a encoding method and a decoding method, wherein the encoding method, in which, with a presumed number t of faulty channels, n number of codewords for a message m and n number of faulty codeword identifying data are output, comprises:

generating a polynomial of an n−(t+1) degree on a finite field, in which the message is embedded, and generating n number of the polynomials with the codewords for a message placed at different points on each polynomial;

generating a polynomial G of the degree t on a finite field, with the codeword for the message as an input, processing the codewords of the message so that the codewords will be of different values over the finite field, and generating an output obtained by entering the processed values to the polynomial G of the degree t as faulty codeword identifying data, in association with the codewords for the message; and outputting the codewords for the message and the faulty codeword identifying data, and wherein the decoding method that inputs the codewords for the message and the faulty codeword identifying data, output from the encoding method according, the number of channels n and the presumed number t of faulty channels to output a message, comprises:

performing error correction to the faulty codeword identifying data and restoring the polynomial of the degree t, in which the faulty codeword identifying data has been generated, by the faulty codeword identifying data that undergoes the error correction;

processing the total of the codewords for the message in the polynomial of the degree t restored, in the same way as in the encoder; deciding whether or not the values of the codewords processed, entered to the restored polynomial of the degree t, are equal to the faulty codeword identifying data associated with the codewords for the message before the processing; and generating a list of the total of the codewords of the message decided to be equal;

deciding whether or not the total of the codewords of the message contained in the list is the codewords of the same message; and decoding the message from the codewords decided to be non-faulty and outputting the resulting message in case it has been decided that the total of the codewords of the message contained in the list is the codewords of the same message, and outputting a failure in decoding if otherwise.

12. A non-transitory computer-readable recording medium storing an encoding program that causes a computer constituting an encoder outputting n number of codewords for a message m and n number of faulty codeword identifying data, with a presumed number t of faulty channels, to execute:

a message encoding process that generates a polynomial F of the degree n−(t+1) on a finite field, in which the message is embedded, with n number of the polynomials being generated with different points on the polynomials as codewords of the message;

a faulty codeword identifying data generation process that inputs the codewords for the message and generates a polynomial G of the degree t on a finite field, the faulty codeword identifying data generation process processing the codewords of the message so that the codewords will be of different values over the finite field, and generating an output obtained on entering the processed values to the polynomial G of the degree t, as faulty codeword identifying data, in association with the codewords for the message; and a process that outputs the codewords for the message and the faulty codeword identifying data.

13. A non-transitory computer-readable recording medium storing a decoding program that causes a computer constituting a decoder inputting the codewords of the message and the faulty codeword identifying data, output from the encoder according to claim 12, the number of channels n and the presumed number t of faulty channels, and outputting the message, to execute:

a faulty encoded message decision process that performs error correction to the faulty codeword identifying data and that restores the polynomial of the degree t, in which the faulty codeword identifying data has been generated, by the faulty codeword identifying data that undergoes the error correction;

the faulty encoded message decision process processing the total of the codewords for the message in the polynomial of the degree t restored, in the same way as in the encoder, deciding whether or not the values of the codewords processed, entered to the restored polynomial of the degree t, are equal to the faulty codeword identifying data associated with the codewords for the message before the modification; and outputting a list of the total of the codewords of the message decided to be equal; and a message decoding process that decides whether or not the total of the codewords of the message contained in the list output from the faulty encoded message decision unit is the codewords of the same message, the message decoding process decoding the message from the codewords decided to be non-faulty and outputting the resulting message in case of decision that the total of the codewords of the message contained in the list is the codewords of the same message, the message decoding process outputting a failure in decoding if otherwise.

* * * * *